United States Patent
Bezzam

(10) Patent No.: US 11,128,281 B2
(45) Date of Patent: *Sep. 21, 2021

(54) REDUCED-POWER ELECTRONIC CIRCUITS WITH WIDE-BAND ENERGY RECOVERY USING NON-INTERFERING TOPOLOGIES

(71) Applicant: REZONENT CORPORATION, Los Altos, CA (US)

(72) Inventor: Ignatius Bezzam, Los Altos, CA (US)

(73) Assignee: REZONENT CORPORATION, Los Altos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/569,060

(22) Filed: Sep. 12, 2019

(65) Prior Publication Data

US 2020/0007112 A1    Jan. 2, 2020

Related U.S. Application Data

(63) Continuation of application No. 15/974,226, filed on May 8, 2018, now Pat. No. 10,454,455.
(Continued)

(51) Int. Cl.
  *G05F 1/04*    (2006.01)
  *H03K 3/012*   (2006.01)
(Continued)

(52) U.S. Cl.
  CPC .............. *H03K 3/012* (2013.01); *G06F 1/06* (2013.01); *G06F 1/10* (2013.01);
(Continued)

(58) Field of Classification Search
  CPC .... G06F 1/10; G06F 1/04; G06F 1/08; H03K 5/135; G11C 7/22
(Continued)

(56) References Cited

U.S. PATENT DOCUMENTS 3,080,489 A    3/1963    White
5,126,589 A    6/1992    Renger
(Continued)

FOREIGN PATENT DOCUMENTS

JP    2000152665 A    5/2000

OTHER PUBLICATIONS

Office Action for U.S. Appl. No. 15/974,240, dated Nov. 19, 2018, 13 pages.
(Continued)

*Primary Examiner* — Quan Tra
(74) *Attorney, Agent, or Firm* — Jaffery Watson Mendonsa & Hamilton LLP

(57) ABSTRACT

Described herein are reduced-power electronic circuits with wide-band energy recovery using non-interfering topologies. A resonant clock distribution network comprises a plurality of resonant clock drivers that receive at least one of a plurality of reference clock signals. An energy saving component is coupled with the plurality of resonant clock drivers. The energy saving component provides for lower energy consumption by resonating with unwanted parasitic capacitance of a load capacitance. The energy saving component and the load capacitance (LC) form a series resonant frequency that is significantly greater than a clock frequency of the plurality of resonant clock drivers, so that output clock signal paths are not interfered with and so that effects on skew are minimized.

19 Claims, 14 Drawing Sheets

Related U.S. Application Data

(60) Provisional application No. 62/562,996, filed on Sep. 25, 2017.

(51) Int. Cl.
*G06F 1/06* (2006.01)
*G06F 1/10* (2006.01)
*H03K 3/356* (2006.01)
*H03K 17/687* (2006.01)

(52) U.S. Cl.
CPC ... *H03K 3/356104* (2013.01); *H03K 17/6872* (2013.01); *H03K 2217/009* (2013.01)

(58) Field of Classification Search
USPC .................................. 327/291–298, 108–112
See application file for complete search history.

(56) References Cited

U.S. PATENT DOCUMENTS

| | | | |
|---|---|---|---|
| 5,396,527 A | 3/1995 | Schlecht et al. | |
| 5,402,133 A | 3/1995 | Merenda | |
| 5,559,463 A | 9/1996 | Denker | |
| 5,804,943 A | 9/1998 | Kollman et al. | |
| 5,949,199 A | 9/1999 | Qian | |
| 6,242,951 B1 | 6/2001 | Nakata et al. | |
| 6,311,145 B1 | 10/2001 | Hershenson et al. | |
| 6,559,681 B1 | 5/2003 | Wu et al. | |
| 6,725,030 B2 | 4/2004 | Vathulya | |
| 6,870,437 B2 | 3/2005 | Chang et al. | |
| 7,098,703 B2 | 8/2006 | Harvey | |
| 7,459,940 B2 | 12/2008 | Franch | |
| 7,499,290 B1 | 3/2009 | Mazzola | |
| 7,583,156 B2 | 9/2009 | Hung | |
| 7,667,550 B2 | 2/2010 | Palma | |
| 7,746,300 B2 | 6/2010 | Zhang et al. | |
| 7,973,565 B2 | 7/2011 | Ishii et al. | |
| 8,184,456 B1 | 5/2012 | Jain et al. | |
| 8,339,209 B2 | 12/2012 | Papaefthymiou et al. | |
| 8,358,163 B2 | 1/2013 | Papaefthymiou et al. | |
| 8,362,811 B2 | 1/2013 | Papaefthymiou et al. | |
| 8,368,450 B2 | 2/2013 | Papaefthymiou et al. | |
| 8,400,192 B2 | 3/2013 | Papaefthymiou et al. | |
| 8,450,991 B2 | 5/2013 | Runas et al. | |
| 8,461,873 B2 | 6/2013 | Ishii et al. | |
| 8,502,569 B2 | 8/2013 | Papaefthymiou et al. | |
| 8,593,183 B2 | 11/2013 | Papaefthymiou et al. | |
| 8,659,338 B2 | 2/2014 | Papaefthymiou et al. | |
| 8,704,576 B1 | 4/2014 | Bucelot et al. | |
| 8,791,726 B2 * | 7/2014 | Bonaccio | G06F 1/32 327/109 |
| 8,990,761 B2 | 3/2015 | Kashiwakura | |
| 9,041,451 B2 | 5/2015 | Papaefthymiou et al. | |
| 9,231,472 B2 | 1/2016 | Gong | |
| 9,330,214 B2 | 5/2016 | Valdes-Garcia et al. | |
| 9,734,265 B2 | 8/2017 | Arora et al. | |
| 10,340,895 B2 * | 7/2019 | Bezzam | G06F 1/10 |
| 10,348,300 B2 | 7/2019 | Salem et al. | |
| 10,454,455 B2 | 10/2019 | Bezzam | |
| 10,510,399 B2 | 12/2019 | Huffman | |
| 2002/0060914 A1 | 5/2002 | Porter | |
| 2002/0086649 A1 | 7/2002 | Vathulya | |
| 2004/0145411 A1 | 7/2004 | Harvey | |
| 2004/0189365 A1 | 9/2004 | Nakata et al. | |
| 2004/0227486 A1 | 11/2004 | Kerlin | |
| 2004/0246061 A1 | 12/2004 | Chang et al. | |
| 2006/0158911 A1 | 7/2006 | Lincoln | |
| 2007/0257861 A1 | 11/2007 | Zhang et al. | |
| 2008/0150606 A1 | 6/2008 | Kumata | |
| 2011/0175591 A1 | 7/2011 | Cuk | |
| 2014/0097791 A1 | 4/2014 | Lisuwandi | |
| 2015/0054355 A1 | 2/2015 | Ben-Shalom | |
| 2015/0061632 A1 | 3/2015 | Philbrick et al. | |
| 2015/0084607 A1 | 3/2015 | Hayami | |
| 2015/0097620 A1 | 4/2015 | Adamski | |
| 2017/0214433 A1 | 7/2017 | Redman-WHite | |
| 2019/0095568 A1 | 3/2019 | Bezzam | |
| 2019/0097626 A1 | 3/2019 | Bezzam | |
| 2020/0007112 A1 | 1/2020 | Bezzam | |

OTHER PUBLICATIONS

Bezzam, "An Energy-Recovering Reconfigurable Series Resonant Clocking Scheme for Wide Frequency Operation", IEEE Transactions on Circuits and Systems—I: Regular Papers, vol. 62, No. 7, Jul. 2015, 10 pages.

Notice of Allowance for U.S. Appl. No. 15/974,240, dated Apr. 26, 2019, 7 pages.

K. Suhwan, C. Ziesler, M. Papaefthymiou, "Charge-recovery computing on silicon," IEEE Transactions on Computers, vol. 54, issue 6, pp. 651-659, Jun. 2005.

Yibin Ye and K. Roy "Energy recovery circuits using reversible and partially reversible logic," IEEE Transactions on Circuits and Systems I: Fundamental Theory and Applications, vol. 43, Issue: 9, pp. 769-778, 1996.

Office Action for U.S. Appl. No. 15/974,226, dated Jun. 28, 2019, 6 pages.

Notice of Allowance for U.S. Appl. No. 15/974,226, dated Aug. 29, 2019, 5 pages.

Office Action for U.S. Appl. No. 16/024,613, dated Mar. 19, 2020, 11 pages.

Bezzam, "A Pulsed Resonance Clocking for Energy Recovery", 978-1-4799-3432-4, 2014 IEEE, pp. 2460-2763.

Final Office Action, U.S. Appl. No. 16/024,613, dated Jul. 9, 2020, 11 pages, USPTO.

Non-Final Office Action, U.S. Appl. No. 16/024,613, dated Oct. 29, 2020, 7 pages, USPTO.

Notice of Allowance, U.S. Appl. No. 16/024,613, dated Mar. 10, 2021, 7 pages, USPTO.

* cited by examiner

US 11,128,281 B2

REDUCED-POWER ELECTRONIC CIRCUITS WITH WIDE-BAND ENERGY RECOVERY USING NON-INTERFERING TOPOLOGIES

RELATED APPLICATIONS

This application is a continuation of U.S. Non-Provisional application Ser. No. 15/974,226, filed on May 8, 2018, which claims the benefit of U.S. Provisional Application No. 62/562,996, filed on Sep. 25, 2017, the entire contents of which are hereby incorporated by reference.

TECHNICAL FIELD

Embodiments of the present invention relate generally to the design of integrated electrical circuits and integrated electrical circuit systems. Specifically, embodiments of the present invention pertain to the design of on-chip circuits that include, but are not limited to, signaling circuits, data processing circuits, timing circuits, and logic circuits.

BACKGROUND

On-chip clocking circuits are ubiquitous in electronic devices for timing, data, logic, and memory in synchronous systems. A clock network requires repetitive energization and de-energization of circuit nodes between logical "zero" and "one" states. This switching between states leads to wasteful power consumption and/or heating. This heating often limits the performance of these circuits and of commercial and non-commercial devices and systems that are made from these circuits.

Approaches have been developed in attempts to reduce clock system heating. These methods include non-resonant and resonant strategies. Other methods for increasing energy efficiency, such as dynamic voltage and frequency scaling (DVFS), and adiabatic charging and discharging, have been demonstrated. These methods reduce heating but cannot be used concurrently at GHz speeds. For example, DVFS can save average energy over extended use, but the method ultimately wastes energy every time an output goes from "one" to "zero" states.

SUMMARY

Described herein are reduced-power electronic circuits with wide-band energy recovery using non-interfering topologies. A resonant clock distribution network comprises a plurality of resonant clock drivers that receive at least one of a plurality of reference clock signals. An energy saving component is coupled with the plurality of resonant clock drivers. The energy saving component provides for lower energy consumption by resonating with unwanted parasitic capacitance of a load capacitance. The energy saving component and the load capacitance (LC) form a series resonant frequency that is significantly greater than a clock frequency of the plurality of resonant clock drivers, so that output clock signal paths are not interfered with and so that effects on skew are minimized.

BRIEF DESCRIPTION OF THE DRAWINGS

The present invention is illustrated by way of example, and not by way of limitation, in the figures of the accompanying drawings and in which.

DETAILED DESCRIPTION

Figure 1B:
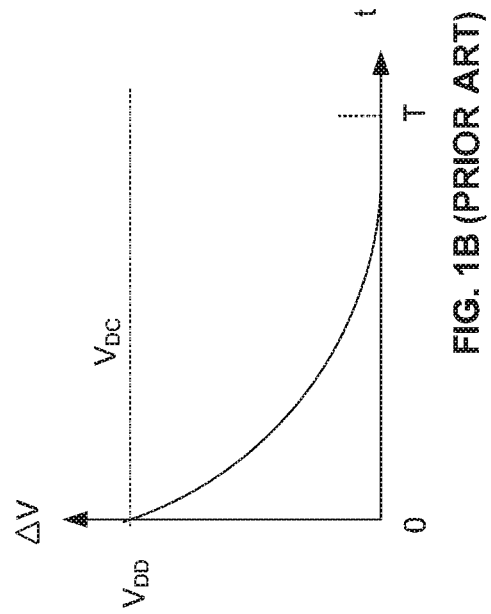
FIGS. 1A-1D show prior art having an adiabatic charging principle.

Various examples of the invention will now be described. The following description provides specific details for a thorough understanding and enabling description of these examples. One skilled in the relevant art will understand, however, that the invention may be practiced without many of these details. Likewise, one skilled in the relevant art will also understand that the invention can include many other obvious features not described in detail herein. Additionally, some well-known structures or functions may not be shown or described in detail below, to avoid unnecessarily obscuring the relevant description.

The terminology used below is to be interpreted in its broadest reasonable manner, even though it is being used in conjunction with a detailed description of certain specific examples of the invention. Indeed, certain terms may even be emphasized below; however, any terminology intended to be interpreted in any restricted manner will be overtly and specifically defined as such in this Detailed Description section.

Described herein are reduced power circuits that can recover electrical energy while large-capacitive load drivers undergo voltage transitions at their outputs from higher-energized states to lesser-energized states for some or all of a voltage cycle. The power associated with these transitions is a significant portion of the total energy consumption in system on chips (SoCs) when low skew is necessary, for the highest speed operation. This storage and reuse of electrical energy results in reduced heating, as energy is not wasted, and results in reduced power consumption since the energy stored is reused for a next transition to a higher energy state.

The present method achieves this without needing to attach additional disruptive circuits onto the critical clock or signal line that could be detrimental to the low skew and matching required for system performance.

On-chip output load capacitance for clock circuits are inherently capacitive, yet this output load capacitance itself does not dissipate switching energy by itself. Instead, switching energy is lost within the switch's driving transistors during each of the many, repetitious on-off cycles, while the clock's output node is charging and discharging. This energy loss can be interpreted current-resistance (I-R) losses from charging & discharging currents being driven through the inherent parasitic resistances of the transistor switches. Due to charging and discharging happening during each clock cycle, the total power loss $P_{NR}$ is frequency dependent and can be commonly written, for non-resonant (NR) clocks, as $P_{NR}=CV^2 *f$.

The descriptions of the devices and methods herein are mostly for use in on-chip clocking circuits and other types of circuits (e.g., data circuits, logic circuits, memory circuits) in which the input states and/or output states of the circuit are required to switch their voltages back-and-forth frequently between more highly energized states and states of lesser energy without needing the outputs to be tied together (i.e., without needing the outputs to be connected together).

The novel method presented herein is engaged only for the rise and fall transitions of the digital driver rather than the entire digital driver period set by the clock frequency, and thus is not tied to one clock frequency. This property permits an energy recovery and reuse over the entire frequency range below a maximum setting, thus enabling dynamic voltage and frequency scaling (DVFS). In other words, the novel method described in this disclosure is inherently broad-banded. Thereby making it compatible with complementary methods of power reduction, such as with DVFS.

Run-time optimization of the operation of the new methods described herein, through digital pulse-width control, results in maximum savings of the clock power to compensate for inductor variations. CDN power savings can total to several watts of power in current DSM processors, SoCs and ASICs.

As previously discussed, although DVFS does lowers overall power consumption, DVFS does not reuse energy. Thus, DVFS is complementary to circuit methods that reuse energy, and can be concurrently used with circuit methods that reuse energy. Adiabatic charging & discharging is one way of reusing energy. However, adiabatic charging & discharging is not amenable to GHz speeds.

Figure 1A:
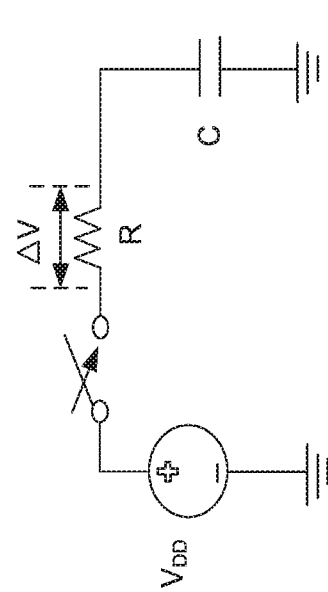

A conventional model of a logic driver switch is illustrated in a current waveform of FIG. 1A and a circuit of FIG. 1B. The transition of a circuit node from LOW to HIGH can be modelled as charging an RC tree through a switch, where C is the capacitance of the node and R is the resistance of the switch and interconnect of the circuit. When the switch is closed, a high voltage nV is applied across R and current starts flowing suddenly through R. After a short period of time, C is charged to a constant supply voltage $V_{DD}$. The energy taken from the power supply $V_{DC}$ is $CV_{DD}^2$, but only half of that, is stored in C. The other half is dissipated in R for this example.

Figures 1C, 1D:
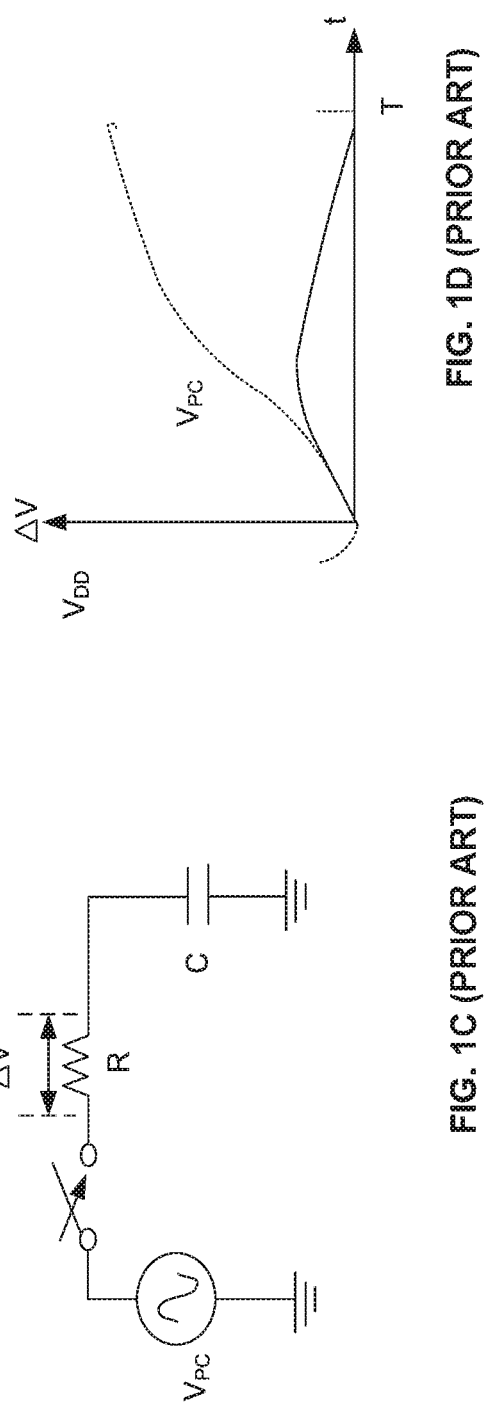

In one example of an Adiabatic Method, consider the circuit of FIG. 1D and a current waveform of FIG. 1C for adiabatic charging. Notice that, in contrast to conventional charging, a transition of a circuit node from LOW to HIGH has been slowed down by using a time varying voltage source ($V_{PC}$) instead of a fixed supply. By spreading out the charge transfer more evenly over the entire time available, peak current is greatly reduced. The overall energy dissipated $E_R$ in the transition has been shown to have a proportional relationship $$E_R \propto (RC/T_S)CV_{DD} \qquad \text{(equation 1)}$$

where R is the effective resistance of the driver device, C is the capacitance to be switched, $T_S$ is the time over which the switching occurs, and $V_{DD}$ is the voltage to be switched across. The constant of proportionality is related to the exact shape of the time-varying voltage source waveform and can be calculated by direct integration.

Ideally, by increasing the time $T_S$ over which computation is performed, it should be possible to create a circuit which computes with vanishingly low energy dissipation as the time allowed for that computation extends indefinitely. Known in the field as "asymptotically zero energy consumption," practical circuit implementations of these logic components have been demonstrated. These circuits achieve low, but nonzero, dissipation for computations performed over fixed amounts of time.

The terms "charge recovery" or "energy recycling" are used to describe these adiabatic-based circuits because some of the energy in these adiabatic-based circuits (in the form of charge stored on capacitances) is recovered instead of dissipated. Broadly speaking, the term "charge recovery" is currently being used to describe systems that reclaim some of the energy that is stored in their capacitors during a computation and reused during subsequent computations. It should be observed that whenever electrical current experiences a voltage drop $\Delta V$, energy is dissipated at the rate of $i \times \Delta V$ (instantaneous dissipative power), where i is the current. Such energy dissipation can be greatly minimized by deploying adiabatic switching described herein, where the voltage supply swings gradually from 0 to $V_{DD}$. There is little voltage drop across the channel of a PMOS/NMOS transistor, and hence only a small amount of energy is dissipated. Using a simple model of (equation 1) to estimate the power dissipation, with RC<1 nanosecond (ns) for a moderate fan-out, and switch sampling time of $T_S \approx (1/f_{CLK})$ and with an operating clock frequency $f_{CLK} \approx 10$ MHz, $E_R$ is reduced to a very small value of nearly $\frac{1}{50}^{th}$ of conventional switching. At higher frequencies, of course, the savings are less.

For Resonant Circuit Methods, single-frequency resonant clock distribution networks have been proposed for the energy-efficient distribution of clock signals only in synchronous digital systems. In these networks, energy-efficient operation is achieved using one or more inductors that are connected to the sensitive output node to resonate the parasitic output capacitance of the clock distribution network. Clock distribution with extremely low jitter is achieved through the reduction in the number of clock buffers sufficient near the singular resonant frequency value for the clock.

Symmetric all-metal distribution networks help in extremely low skew distributed clock signals and reduce parasitic capacitances. However, lower parasitics need higher value and area for resonating inductors. Overall network performance also depends on operating speed and on total network inductance, resistance, size, and topology, with lower-resistance symmetric networks resulting in lower jitter, less harmful skew, and reduced energy consumption when designed with sufficiently large inductances values.

These approaches, however, need large metal areas that could potentially block signal routing.

In practice for DVFS methods, digital devices are often specified and designed to operate at multiple clock frequencies. For example, a high-performance microprocessor may be designed to operate at multiple clock frequencies ranging from 100 MHz to 4 GHz. The technique of operating a clock signal at different clock frequencies over time is commonly referred to as frequency scaling and is motivated by the need to reduce power consumption in semiconductor devices. Power consumption in digital semiconductor devices grows in proportion with the rate at which these devices switch between their digital values. When performance requirements decrease, this rate can be reduced by reducing the frequency of the clock signal, thereby reducing power consumption. Power also grows by square of supply voltage. At lower frequencies of operation, lower supply voltages are sufficient, significantly reducing energy.

It would be useful to have a method that is compatible to DVFS, yet also reuses energy during the billions of transitions per second from one to zero states in clock circuits. Moreover, traditional adiabatic solutions are not DVFS compliant, but in embodiments of the present invention the adiabatic solutions can be optionally enabled. The challenge with the deployment of resonant clock distribution networks in multi-frequency operation contexts is that these networks typically achieve their highest energy efficiency for a relatively narrow range of clock frequencies centered around the natural frequency of the resonant network. For clock frequencies outside this narrow range, energy efficiency degrades significantly, and to an extent that can outweigh the inherent energy advantages of resonant clocking.

For example, consider a microprocessor that has been designed with a target frequency of 4 GHz, but its digital logic can only achieve a peak clock rate of 3 GHz after manufacturing. In a non-resonant clock implementation of the microprocessor, the clock network can be operated at 3 GHz, consuming power in proportion to its 3 GHz operating frequency. In a resonant clock design, however, if the resonant clock network operates at 3 GHz, instead of its natural frequency of 4 GHz, its power consumption can significantly exceed the power consumption of the non-resonant design at 3 GHz.

To extend the frequency ranges of narrow-banded resonant clocking networks, multiple narrow-band inductive-capacitive (LC) sub-circuits have been proposed that use area-consuming real-time reconfiguration methods, using a further number of large-value inductors.

| Nomenclature: | |
| --- | --- |
| C | Capacitor |
| CDN | Clock Distribution Network |
| CL | Load Capacitor |
| CMOS | Complementary Metal Oxide Semiconductor |
| COUT | Output Capacitor |
| CPR | Continuous Parallel Resonance |
| D | Data input of a flip-flop |
| DC | Direct Current |
| DCR | DC resistance of inductor |
| DDR | Double Data Rate |
| DET | Dual Edge Triggering |
| DVFS | Dynamic Voltage Frequency Scaling |
| EC | Energy stored on capacitor C per cycle |
| EMI | Electro-Magnetic Interference |
| ESR | Electrical Series Resistance of Capacitor |
| EVDD | Energy drawn from VDD supply per cycle |
| fCLK | Clock Frequency |
| fR | Frequency of damped oscillations |
| fRES | ideal Frequency of Resonance |
| GSR | Generalized Series Resonance |
| IC | Integrated Circuit |
| iL | Inductor Current |
| INV | Standard medium Inverter driving 1 pF load |
| IR | Intermittent Resonance |
| L | Inductor |
| LC | Inductor (L) Capacitor (C) series/parallel combination |
| LCB | Local Clock Buffers |
| MEMS | Micro-Electro-Mechanical Systems |
| MS | Master Slave |
| NEMS | Nano-Electro-Mechanical Systems |
| NMOS | N-type Metal Oxide Semiconductor |
| NR | No Resonance |
| Pavg | Average Power per cycle |
| Pavg | Average Power per cycle |
| PCPR | CPR Power |
| PGSR | GSR Power |
| PLS_CLK | Clock Pulse Stream |
| PMOS | P-type Metal Oxide Semiconductor |
| PNR | Non-Resonant Power |
| PPA | Power, Performance and Area |
| PPSR | PSR Power |
| PSR | Pulsed Series Resonance |
| Q (italicized) | Quality factor |
| Q | Output of flip-flop |
| QC | Component Quality factor of Capacitor C |
| QL | Component Quality factor of Inductor L |
| Rd | pull-Down switch Resistance |
| RF | Radio Frequency |
| Rp | Inductor parallel Resistance equivalent to DCR |
| Rr | Resonance on-off switch Resistance |
| Ru | pull-Up switch Resistance |

Nomenclature:

| | |
|---|---|
| Rw | Interconnect Wire Resistance |
| SCB | Sector Clock Buffers |
| SoC | System on Chip |
| TCLK | Clock Period |
| TPW | Pulse Width Time |
| TSPC | True Single Phase Clocking |
| VC | Capacitor Voltage |
| VDD | Power Supply voltage connected to Drain of PMOS |
| Vin | Input Voltage |
| VLB | Inductor Bias Voltage |
| VOH | logic Output High Voltage |
| VOL | logic Output Low Voltage |
| VOUT | Output Voltage |
| μ | micro meter units |
| τ | time constant |

Figure 3:
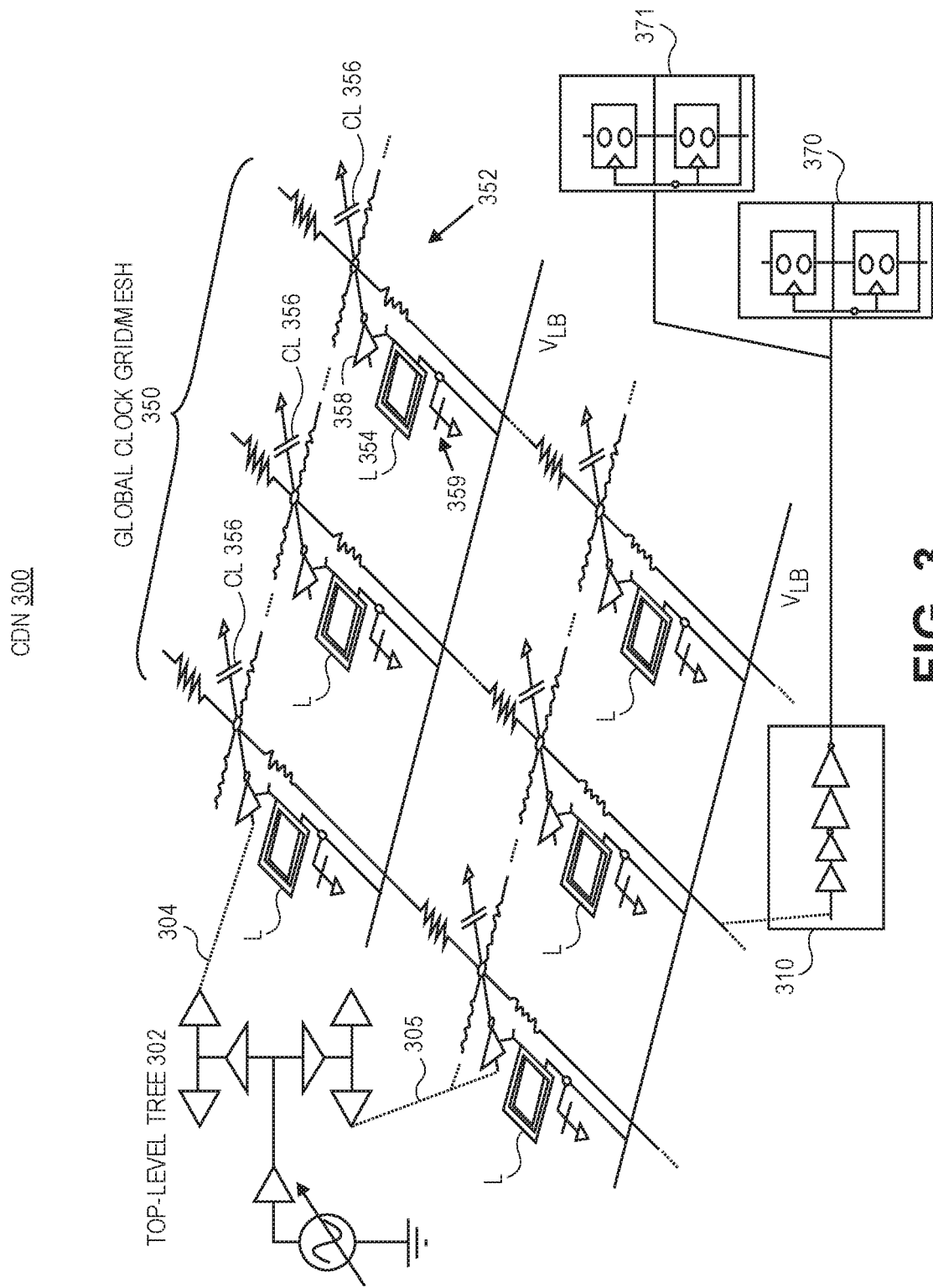
FIG. 3 shows a diagram of a portion of a clock distribution network (CDN) 300 for an embodiment of the present invention that does not disturb the grid and provides less skew.

FIG. 3 shows a resonant clock distribution network (CDN) 300 in accordance with one embodiment for a semiconductor device. In this CDN 300, a buffered distribution network (e.g., global clock grid/mesh 350) is used to distribute a reference clock signal (e.g., 304, 305) to multiple resonant clock drivers (e.g., 352) that are in turn used to drive the clock signal across an all metal dock distribution network.

Typically, this all-metal network has an approximately symmetric topology, delivering the dock signal to the clocked components (for example, flip-flops 370, 371 and clock buffers 310) of the semiconductor device with very low skew. Each resonant clock driver incorporates an inductor (e.g., L 354) that is used to provide additional drive strength with low energy consumption by resonating the parasitic capacitance of the load (e.g., CL 356) seen by the driver. The drivers can be as simple as standard CMOS inverters (e.g., 358). The inductors are connected to a low impedance pull down (AC ground) line (e.g., 359) of the driver and do not interfere with a skew sensitive signal path of the clock driver.

In one example, a system for reduced power in an electronic circuit with wide-band energy recovery using non-interfering topologies comprises a resonant clock distribution network (e.g., 300 of FIG. 3) that comprises a buffered clock distribution network (e.g., 350) that distributes a plurality of reference clock signals (e.g., 304, 305) from a top-level tree 302, and a plurality of resonant clock drivers (e.g., 352) that receive at least one of said plurality of reference clock signals (e.g., 304, 305). The plurality of resonant clock drivers (e.g., 352) are in turn used to drive a plurality of clock inputs signal. A plurality of metal clock distribution networks delivers said plurality of clock inputs signals to clocked components. The clocked components comprise a plurality of flip flops (e.g., 370, 371), and a plurality of clock buffers (e.g., 310). An inductor (e.g., 354) connects with said plurality of resonant clock drivers (e.g., 352). The inductor provides for additional strength with lower energy consumption by resonating with unwanted parasitic capacitance of a load (e.g., 356). The inductor and the capacitance (LC) form a series resonant frequency that is significantly greater (e.g., at least 3 times, 3 times to 100 times) than a clock rate, so that the output clock signal paths are not interfered with and so that effects on skew are minimized. The inductor is electrically connected in series with capacitance (e.g., 356) through a switch. The inductor is only switched in when needed for recycling the energy stored initially in the capacitance (e.g., 356) thus the switch is open when energy recovery is not needed and the series path to the inductor (e.g., 354) is isolated from the skew-sensitive output lines of the global clock grid/mesh. The resonant frequency of the energy recovery portion of the circuit is at least three times higher than the clock frequency. The resonant clock distribution network (e.g., 300) includes a plurality of CMOS inverters (358); AC ground lines (359), and $V_{LB}$ lines.

The systematic, regular 2D grid pattern of distributed inverters enables the present design to deploy modified standard inductor cells, and go into the flow of an automated place and route method (APR), and thus the cells can be optimized for the placement of the cells. This allows us to just change the inverters used in APR. The layout of the inductances may be in a top layer, in a distributed manner, using more than one individual instances of a plurality of inductances.

Figure 4B:
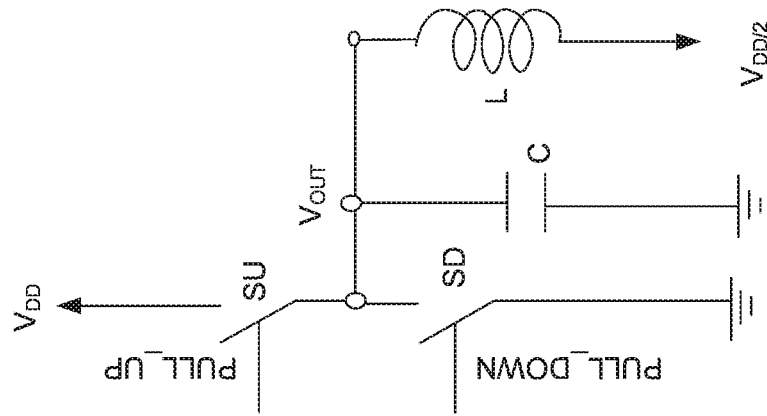
FIGS. 4A and 4B shows topologies of a conventional nonresonant digital logic driver and a prior art parallel resonance digital logic driver.
Figure 4A:
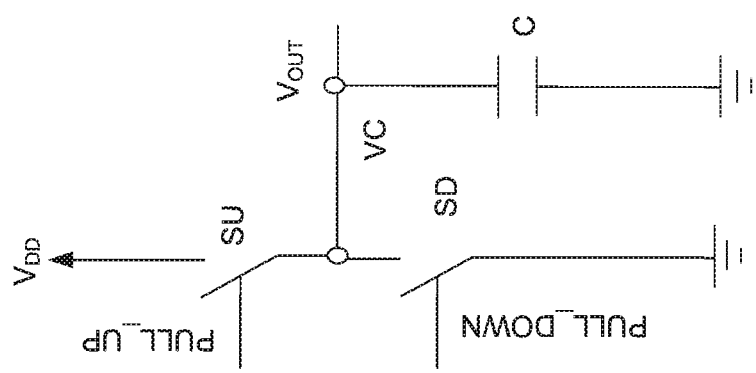
Figure 5:
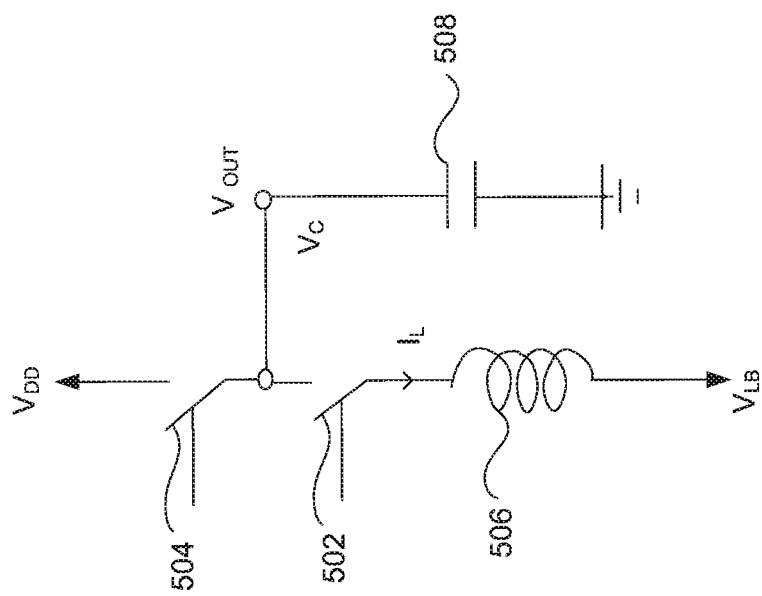
FIG. 5 illustrates a topology of a digital logic driver in accordance with one embodiment.

A topological comparison is illustrated between a traditional non-resonant driver (NR) 400 in FIG. 4A, continuous parallel resonance (CPR) driver 450 in FIG. 4B, and embodiment of the present invention with a Pulsed Series Resonance driver (PSR) 500 in FIG. 5. A prior art resonant clocking technique based on FIG. 4B requires minimum change from conventional clock design inside the basic driver unit but requires modifications at the output on the signal line. Furthermore, the global dock tree is modified to enable resonant (sinusoidal) clocking with an additional metal layer added on top of the conventional tree to attach the inductors and decoupling capacitors in a continuously disruptive way. In contrast, embodiments of the present invention makes the changes from the industry-standard design right inside the driver cell, so that the changes can be automatically repeated across millions of instances without continuously disrupting the sensitive global output lines. The resonant inductive component (e.g., 506, 620, 808) is electrically coupled to a signal path or output node in an intermittent or a periodic manner such that the output lines are not disturbed by the inductive component. In one example, the resonant inductive component is not coupled to the signal path or output node during certain time periods of critical operations while being coupled to the signal path or output node during other time periods to recycle and reuse energy at a load capacitance.

In one example, the use of an inductor bias voltage VLB in series with an energy storage inductor L 506 of FIG. 5 is further connected in series with an NMOS switch 502 featuring an ON state and an OFF state, that is further connected to a circuit node Vout shared by at least one unwanted load capacitance C 508. A series RLC connection forms a series resonant RLC tank with a characteristic series resonant frequency $f_R$ having an initial resonant oscillatory cycle ($T_R=1/f_R$) of a step response. Upon closing the switch 502, for a period Tpw (Tpw larger than $T_R$) to said ON state, a charge on the capacitance C 508 is discharged into the inductor 506 as an energy storage current represented by an inductor charging current $I_L$ and a concurrent capacitor discharging current. The inductor charging current forms an initial charging cycle of said resonant frequency $f_R$ step response to said series RLC circuit while the switch 502 remains closed for a duration corresponding to a period Tpw (whose period Tpw is always shorter in duration that the period of the clock Tclock) and, subsequently, the stored inductive charge is then recovered during said initial resonant frequency $f_R$ step-response cycle as an energy recovery current formed as an inductor discharge current and a concurrent capacitor charging current. The capacitance C 508 is partially charged towards the high logic level (typically $V_{DD}$) even before a pull-up PMOS switch 504 is closed by the said energy recovery current until the duration Tpw of the closed state of the switch expires and said switch 502 reopens to said OFF state thus conserving the said recovered charge on the capacitive node without further charging or discharging through said series RLC path until said switch 502 is closed during the subsequent pulse period Tpw.

In a first example, the PMOS pullup switch 504 has slower hole mobility than electron mobility of a NMOS pulldown switch 502 and thus the PMOS pullup switch 504 is designed with a ratio of Width to length (W/L) that is twice a ratio of W/L of a NMOS pulldown switch 502 in order to have matching impedance of NMOS switch 502 giving faster rise times that minimize dynamic power consumption for a given performance (e.g., clock frequency) and reduce energy consumption by 20% compared to a standard CMOS inverter with no resonance (which too have PMOS W/L twice or more of NMOS W/L). However, these implementations leas to an undesired excessively large PMOS area for driving large loads.

In a second example, the present design has lower power and higher speed performance compared to conventional CMOS inverters. The PMOS pullup switch 504 has a ratio of Width/length that is less than or equal to (e.g., ¾, ⅔, ½, etc) a ratio of W/L of a NMOS pulldown 502 that gives comparable rise times and clock frequency performance of the first example. This design significantly reduces PMOS area and reduces energy consumption even more to 46% compared to a standard CMOS with no resonance. This design provides an area saving benefit of smaller PMOS area without the typical performance drawback of a smaller PMOS area because functionality of the pullup switch in terms of charging the capacitance C 508 is being partially performed with energy recycling or recovery resonance when the driver resonates with the load capacitance C 508 which prefers the PMOS to be in higher impedance mode. Once the inductor energy is recovered however, the PMOS W/L needs to be sufficiently large (e.g., ¾, ⅔, ½, etc) to pull up quickly but need to do so for lesser voltage difference.

Note that for all inductors shown in schematics presented n this disclosure, there is always a small parasitic resistance R in series with the inductor, for the inductors shown in FIGS. 1-6. This resistance determines the lossiness (or nonlossiness) of the inductor. This loss can also be represented by the quality factor (Q value) of the inductor itself or, as an alternative representation, this parasitic series R can contribute significantly to the Q value of the composite LC tank circuit. The parasitic can also be modelled by a much larger parallel R (instead of series R).

The FIGS. 1-6 and FIGS. 8A-8C show clock driver designs, in which the part of the overall clock distribution network serviced by the resonant clock driver is modelled as a lumped capacitor C. The drivers typically use a pull-up PMOS and a pull-down NMOS device for driving the clock distribution network. The PMOS device is connected between the clock node and the power supply terminal. The NMOS device is connected between the clock node and the pulldown (AC ground) terminal. Both devices are driven by the reference clock signal.

Figure 2:
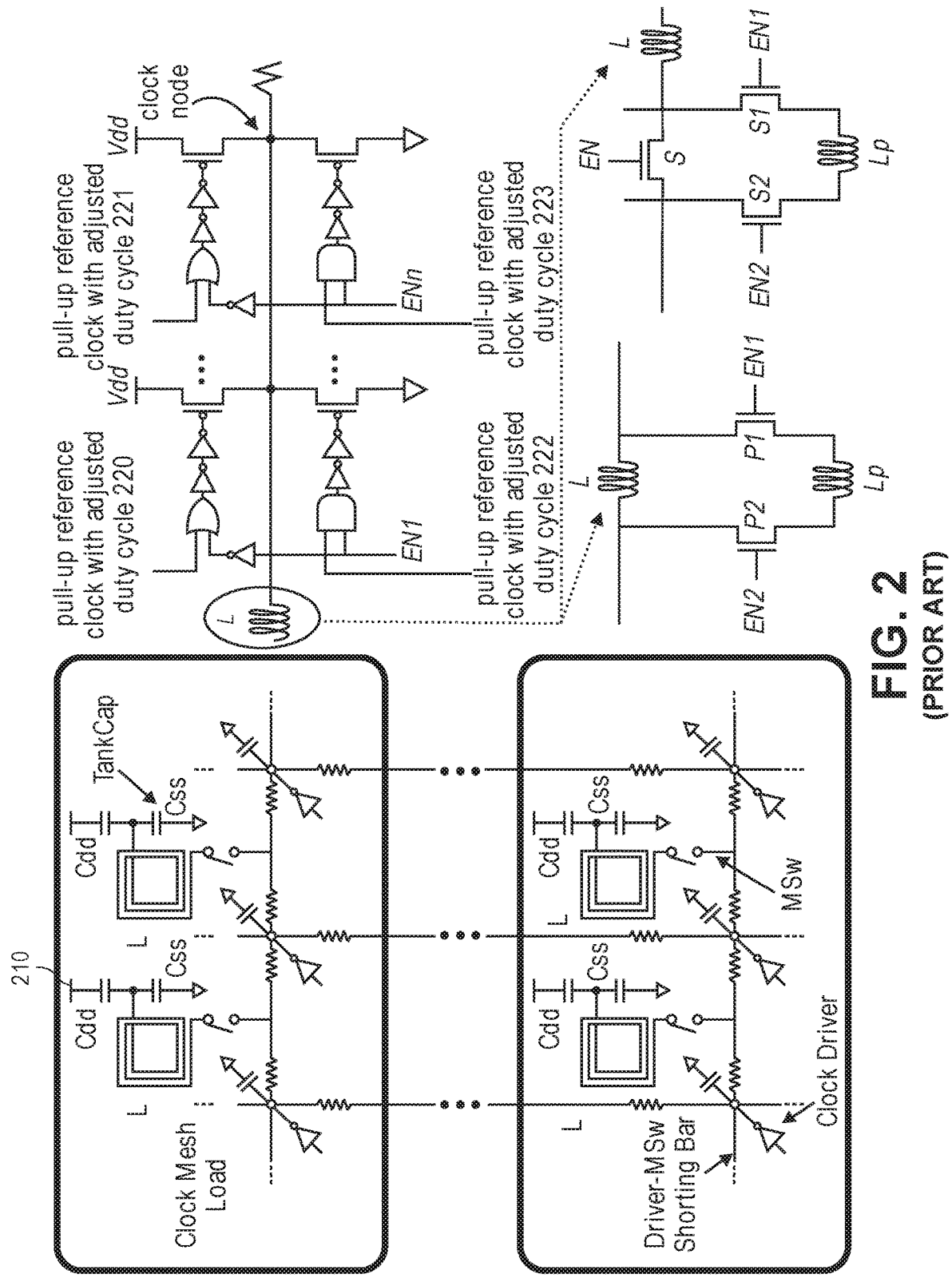
FIG. 2 shows prior art that employs resonant clocking continuously connected at the output node, thus potentially disrupting the output line, which could adversely affect matching and skew.

In FIG. 2, for resonance, an inductor L is connected between the clock node and a supply node, with the voltage of the supply at approximately the midpoint of the clock signal oscillation. For example, if the clock signal oscillates between 0V and 1V, the midpoint supply voltage is approximately 0.5V.

Continuing to refer to FIG. 2, in a typical embodiment, the approximate midpoint voltage is implemented using two capacitors $C_{dd}$ and $C_{ss}$. Capacitor $C_{dd}$ is connected between the mid-point and the power supply terminal 210. Capacitor $C_{ss}$ is connected between the mid-point and the ground terminal. FIG. 2 illustrates pull up reference clocks 220 and 221 as well as pull down reference clocks 222 and 223. To maximize energy savings, the value of the inductor is approximately chosen so that the parallel LC tank set-up by the inductor and the parasitic capacitance of the clock distribution network has a natural frequency that is approximately equal to the frequency of the reference clock signal in prior art.

In contrast, an example of the present invention is shown in FIG. 3. The power savings is not restricted to a relatively narrow clock rate that is centered around the natural frequency that is based on the inductor value and the parasitic capacitance at the clock's load. Thus, in embodiments of the present invention, the resonant condition is not constrained. For example, in embodiments of the present invention, the LC series resonant frequency can be set at least at 3× (3 times) the maximum clock rate and the power saving operation is valid for all clock rates below one third (⅓) of said LC series resonant frequency.

The energy efficiency of the resonant clock driver depends on various design and operating parameters. The quality factor Q of the resonant system is an indicator of its energy efficiency. This factor is proportional to one over R times a quantity of a square root of ratio of L/C where R is the parasitic resistance in the non-ideal inductor. In general, energy efficiency decreases as R increases, due to the $I^2R$ losses associated with the flow of the current I that charges and discharges the parasitic clock load C through its resistance R. Also, for a fixed natural frequency as in the prior-art, energy efficiency decreases as capacitance C decreases from clock resonant value, while embodiments of the current invention are still efficient. For example, if an improved design decreases the parasitic capacitance C (which decreases the non-resonant power consumption $CV^2f$ at the same clock rate), the benefits of the prior-art-resonant design can decrease to a point where the total power can be more than $CV^2f$; in other words, it can do more harm than good if not careful.

The mismatch between the natural frequency of the resonant LC-tank system and the frequency of the reference clock signal is another important factor that affects the energy efficiency of the prior-art resonant clock network. As the frequency of the reference clock that drives the resonant clock driver moves further away from the natural frequency of the resonant clock drives LC-tank, energy efficiency decreases.

When the mismatch between the two frequencies becomes too large, the energy consumption of the prior art parallel resonant clock driver becomes excessive and impractically high. Moreover, the shape of the clock waveform can become so distorted that it cannot be reliably used to clock flip-flops or other clocked components.

Consequently, parallel resonant clock drivers tend to have a more narrow range of clock frequencies within which they operate efficiently than the range of clock frequencies typically supported by a semiconductor device that uses frequency scaling. To support all ranges of operating frequencies used in a frequency-scaled semiconductor device, the present series resonant clock network can operate at all frequencies below a pre-set high value.

Prior art shown here in FIG. 2 shows another possible approach for widening the range of operating frequencies of a resonant clock network by supporting an optional second natural frequency in a resonant clock driver. In this approach, an inductor $L_p$ is selectively introduced in parallel to the original L of the resonant clock driver using a pair of switches P1 and P2. When these two switches are turned off, the total inductance in the resonant clock network is L, and the natural frequency $f_1$ of the resonant clock network is proportional to $1/\sqrt{LC}$. When the two switches are turned on, the total inductance decreased by a factor of $L_p/(L+L_p)$, resulting in a higher natural frequency $f_2$, which is proportional to $$1/\sqrt{C*L*Lp/(L+Lp)}.$$

The main drawback of this approach is that due to the decrease in total inductance, and the additional resistance introduced by switches P1 and P2, operation at f2 has a lower Q ($Q=2\pi f/r$) factor than at f1, thus resulting in decreased relative energy savings. For clock networks operating at GHz frequencies, this decrease in energy savings is exacerbated by the fact that total resistance at the higher operating frequency f2 will be higher than at f1, due to skin effect. Another drawback of this approach is that inductance Lp must be implemented using an inductor in parallel to L, generally resulting in significant area overheads.

For example, to obtain an $f^2$ that is 1.41 times the original $f^2$, a 40% higher inductance $L_p$ must be approximately equal to the original inductance L in the resonant clock driver. This results in doubling of the already-large area of L. The present invention with series-resonant solution does not have these severe limitations, as detailed later.

On the other hand, to decrease f, an inductor $L_s$ is selectively introduced in series with L of the resonant clock driver using switches S1 and S2, along with S as illustrated in FIG. 5. When S is turned on, S1 and S2 are turned off, and the total inductance in the resonant clock network is simply L, and the natural frequency $f_1$ of the resonant clock network is proportional to $1/\sqrt{LC}$, as before. When the S is turned off, and S1 and S2 are turned on, the total inductance is increased by a factor of $(L+L_s)$, resulting in a lower natural frequency $f_3$, which is proportional to $1/\sqrt{(L+L_s)C}$. Again, the drawback of this type of approach is that while the component Q of the two series inductors $(L+L_s)$ remains almost the same, the overall effective Q decreases due to an increase in the series resistance introduced by switches S1 and S2, thus resulting in decreased relative energy savings. An additional drawback now is that for the original frequency f, there is additional resistance coming from switch S, which decreases the Q and consequently the power savings. Thus, if the original frequency f is used, the circuit loses energy savings due to the resistance of (closed) switch S.

Figure 6B:
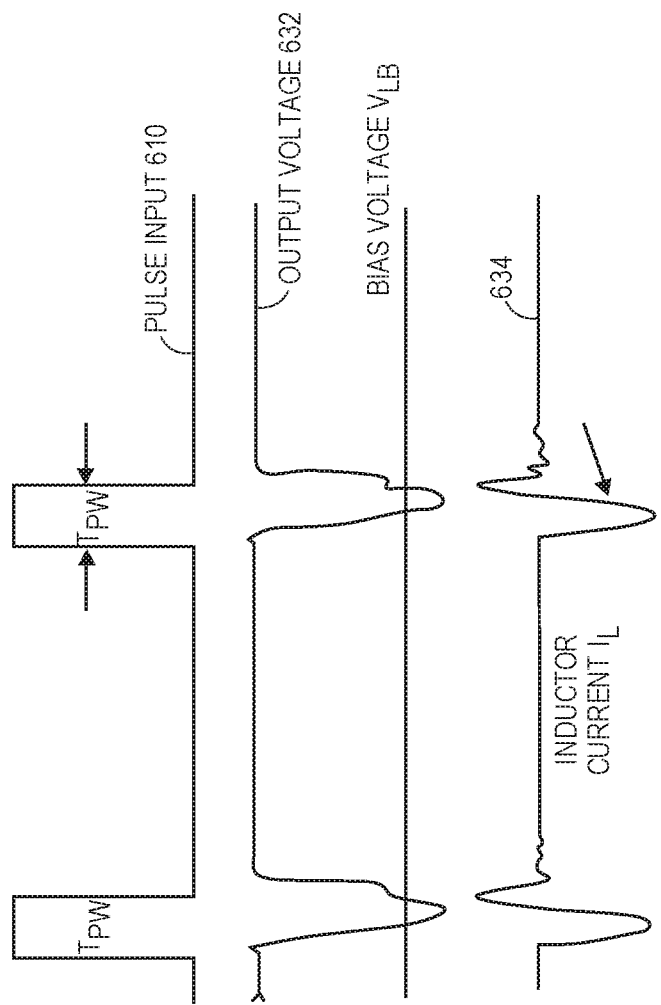
FIGS. 6A and 6B show an embodiment of a simple pulse mode operation of a digital driver with minimal intrusion for wide-band application and minimum change from standard inverters and automatically synthesizable from standard inverters.
Figure 6A:
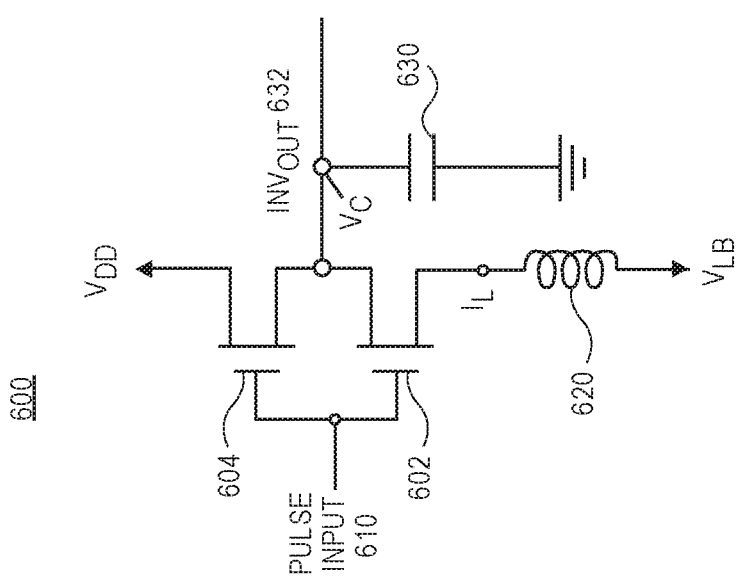

FIG. 6A shows, as an embodiment of the present invention, a wide frequency-range series resonant pulse driver 600 in which the inductor 620 is periodically connected to a load capacitance of a capacitor 630 with a pulse input 610 having controlled input pulse width $T_{PW}$. An output 632 of inverter has a pulse of width $T_{RES}$ (also denoted as "$T_R$" for shorthand) driving a substantially higher capacitive load at resonance. For a substantially ideal inductor (Quality factor QL>>10), both input and output are from 0 to $V_{DD}$ within the clock period $T_{CLK}$. Compared to prior art, the inductor is isolated from the output (i.e., clock or signal line) to the bottom of switch 602. FIG. 6B illustrates pulse input 610, output voltage 632, and inductor current 634 signals.

Figure 6C:
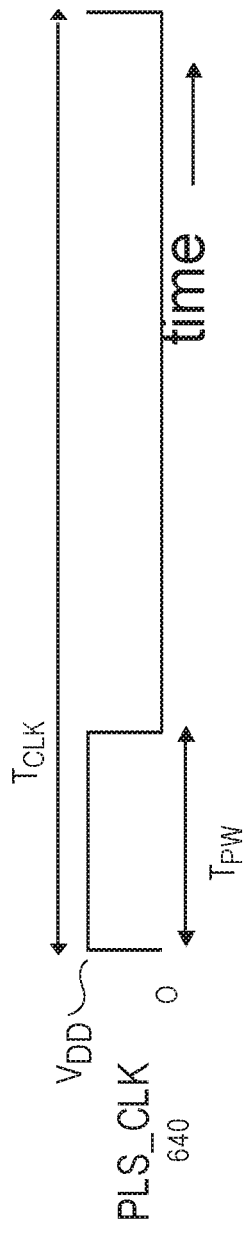
FIG. 6C illustrates a waveform having input pulses of PLS CLK signal 640 that causes the NMOS 602 of FIG. 6A to close making the output go low.

FIG. 6C illustrates a waveform having input pulses of PLS CLK signal 640 that causes the NMOS 602 of FIG. 6A to close making the output go low. The series inductor 620 allows the energy stored on the load capacitor to be transferred into magnetic energy in inductor 620 connected to the $V_{LB}$ node (close to value of $V_{DD}/2$) and then recovered back immediately as electrical energy to make the output go high. This creates a pulse of resonance period $T_R$. Energy can be recycled or recovered with the series LC resonant tank ($f_{RES}=1/2\pi\sqrt{LsC}$) formed when NMOS 602 is closed. Thus, the pull-up PMOS switch 604 does not need to charge the output node (e.g., node 632) to $V_{DD}$ all the way from 0 V and does not need to be as low impedance (large W/L size) as prior-art drivers. Such a pulsed series resonance (PSR) topology can also use bond wire inductors or off-chip inductors not shown in this example embodiment.

The input stream PLS_CLK 640 is required to have a certain width ($T_{PW}$), as shown in FIG. 6C, to generate a resonant pulse stream at the output. FIG. 6B shows the output timing waveforms for the PSR circuit. The energy recovery process is done through the inductor current that stores in heatless (adiabatic) magnetic form in resonant mode.

When input signal PLS_CLK 640 is high, the resonant tank is formed and when PLS_CLK is low, the driver 600 is in non-resonant mode. Unlike in CPR, there is an extra requirement on keeping the incoming pulse width $T_{PW}$ related to $T_{RES}$, across all operating frequencies, for a given $C_L$ and $L_S$. The resonance time is $$T_{RES}=2\pi\sqrt{LsC_L}<T_{CLK}.$$

This inequality requirement, rather than equality in CPR, between $C_L$, $L_S$ and $T_{CLK}$ values provides an extra degree of freedom. Several advantages result from this. When operating with narrow output pulses, $T_{RES}$ is always less than the period $T_{CLK}$, and is thus valid for operation across DVFS. From a circuit design perspective, the PLS_CLK signal (with required $T_{PW}$) can be derived from the regular clock using circuitry shown in FIG. 7. Referring back to FIG. 6B, an analysis of the response shown is first done for a step input from the closing of the switch 502 in FIG. 5 (NMOS 602 in FIG. 6A).

In FIG. 6A, the resonant path of the circuit has a realistic amount of parasitic resistance. The total resistance of the resonant circuit is the series combination RT=(Rr+RW+rS). Here $rS=2\pi f*LS/QL$ is from the finite QL of inductor at frequency f, and can include the output impedance of $V_{LB}$ (e.g., VDD/2) supply as well. The parasitic equivalent series resistance (ESR) of the load capacitance is ignored in this comparative analysis, but can be factored as the component quality factor QC. Thus, the overall tank $Q=2\pi f*L_S/R_T$ is degraded, as $R_T$ is larger than $r_S$.

In FIG. 6B, the input pulse stream is applied with the system clock period $T_{CLK}$ and has a generated pulse-width of $T_{PW}$ for series resonance operation. Embodiments of the present invention automatically generate the correct $T_{PW}$, as described later. FIG. 6B shows an example output pulse with non-ideal inductor (QL<10) when cycling through one clock period. Input pulse width $T_{PW}$ is generally larger than about 75% of damped oscillation cycle $T_R$. Voltage $V_C$ on the capacitor $C_L$ (QC>30) typically does not swing rail-to-rail.

Extra power is needed to restore $V_C$ to logic high (near $V_{DD}$ rail). The width of input pulses ($T_{PW}$) can be designed to be sufficient to allow the inductor current waveform to go through a complete resonance cycle $T_R=1/f_R$, to optimize the possible energy that can be recovered. The output voltage swings by itself until a certain voltage recovery point, without drawing current from $V_{DD}$ power supply. Moreover, the charging and discharging waveforms are adiabatic in nature, thus minimizing transfer losses.

Figure 6D:
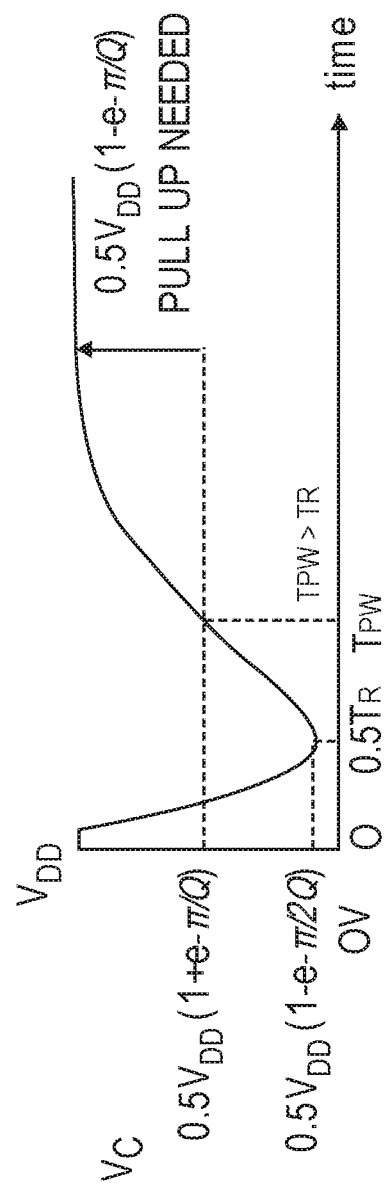
FIG. 6D shows the basic operation of PSR for a 1 GHz clock in a 45 nm compatible process in accordance with one embodiment.

The resonance time, designated as $T_{RES}$, is given by $2\pi\sqrt{LC}$. $T_{PW}$ should thus ideally be of $T_{RES}$ duration, basically the period of resonance for large Q. This period ($T_{RES}=1/f_{RES}$) can be set at a third of maximum $T_{CLK}$ or less. As an example, for a 1 pF load at 1 GHz clock rate, $T_{RES}$ can be set to 0.2 ns using a 1 nH inductor, resulting in a 5 GHz resonance frequency. Conventional continuous parallel resonance (CPR) would need 25 nH to resonate with a 1 pF load. As the inductor described in this disclosure is not continuously connected to the output, it only needs a global bias line $V_{LB}$. FIG. 6D shows the basic operation of PSR for a 1 GHz clock in a 45 nm compatible process. There is some ringing in the current that can be observed in FIG. 6B when the inductor is disconnected and left floating in the non-resonant portion as $T_{PW}$ is larger than $T_{RES}$. This helps to conserve energy.

The overall performance must be viewed along with pulse-based data capture flip-flops (data latches) that take lower power than regular master-slave flip-flops. The PSR-based pulse generator solution (of this disclosure) conveniently generates the required pulses for these energy-saving flip-flops (data latches) while consuming less power than prior art solutions.

Figure 7:
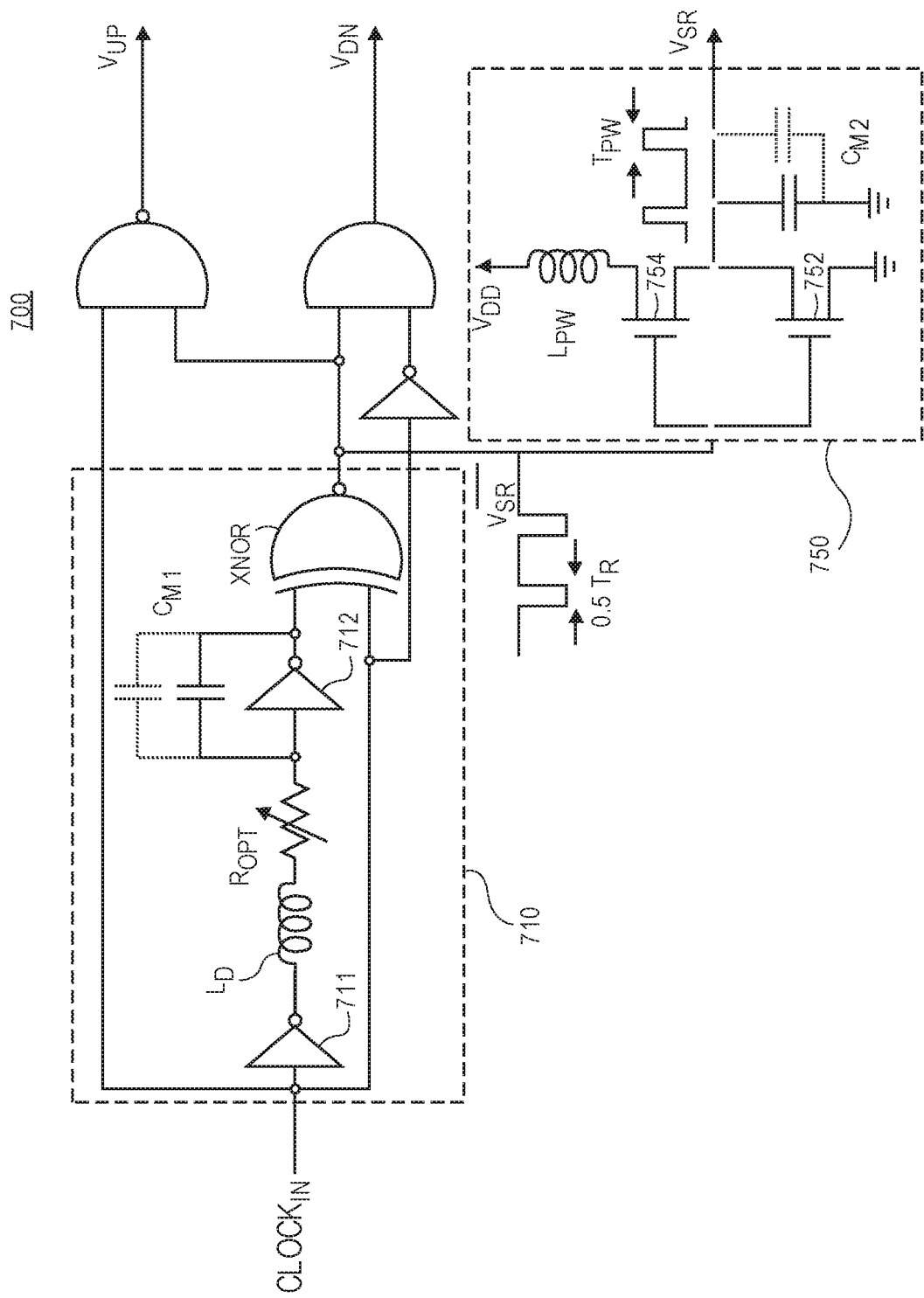
FIG. 7 shows one embodiment of a circuit for controlling digital driver parameters without disrupting a critical signal path.

FIG. 7 shows an embodiment of a circuit 700 for generating a control clock width $T_{PW}$ for PSR without disrupting a signal path in accordance with one embodiment. The circuit 700 includes a Pulse Generator 710 with controlled width and a voltage Doubler 750 to increase the drive on a NMOS switch 752 that has a source that is a higher bias voltage than normal ground. The circuit 700 also generates VUP/DN signals useful for later enhancements in embodiments of the present invention.

Continuing with FIG. 7, in one example, an optimum delay of 0.5 $T_R$ for the actual pulse width $T_{PW}$ is generated from the RLC and inverter (e.g., 711, 712) in the input stage. The series inductor ($L_D$) in FIG. 7 is a replica of L from FIG. 6A (and L in FIGS. 8A-B), and matching capacitance $C_{M1}$ tracks the load $C_L$. The pulse width, $T_{PW}\le\sqrt{L_sC_L}$, is determined by $\sqrt{L_DC_{M1}}$. The inductor $L_{PW}$ is chosen large enough so that $T_{PW}=2\pi\sqrt{L_{PW}(C_{Mr}-C_{M2})}$ is slightly larger than 0.5 $T_R$. Matched delays create pulse widths that are replicas of load capacitance resonance times. GSR inductor control output is at double the supply voltage to reduce switch on-resistance. Here $C_{Mr}$ is the non-negligible gate capacitance of the inductor switching NMOS transistor 752. $C_{M2}$ is also matched to $C_L$ as well as $C_{M1}$. This replica timing eliminates the need for synchronization with conventional DLL/PLL circuitry that would otherwise have required more area and power.

Repeated low-going pulses are generated from both the edges of the input CLOCKin using an XNOR gate and the replica delayed signal. The XNOR output can be inverted to obtain the VSR signal that controls the GSR inductor switch. The other two signals VUP and VDN are readily obtained through logical operations of CLOCKin and the XNOR output. Thanks to the Miller gain around CM1 buffer, it is not necessary to have the entire load capacitance duplicated for a replica delay. This saves power in charging and discharging this capacitor as well. For run-time tuning, accounting for inductor and load capacitance variations, the variable resistor Ropt can be tuned to adjust the RLC delay and change TR appropriately. CM1 and CM2 can be varied to match the loads used, during die to die calibrations.

Continuing now with FIG. 6A, the NMOS 602 switch on-resistance, for the same device size as NR (non-resonance mode), will be higher due to bias voltage of 0.5 $V_{DD}$ at the NMOS M2 source node. The drain-source resistance (switch on-resistance) is inversely proportional to gate-source voltage $V_{gs}$ as seen by the standard formula ½μCOXW ($V_{gs}-V_t$), where μCOX can be considered a constant and 1 is the fixed transistor channel length. While $V_{gs}$ is full gate voltage of $V_{DD}$ in NR case, in PSR it is only half that, as the source is now biased at 0.5 $V_{DD}$. Transistor width (W) can be increased to compensate for this but will increase area and capacitance. Another alternative is to drive the gate ($V_g$) with double the voltage. Resonant techniques can also be used to drive the $V_{SR}$ line itself. A low-power voltage doubler scheme for $V_{SR}$ is shown in FIG. 7 that uses pulsed resonance technique. A pulse resonance based PMOS driver 754 is used as a voltage doubler. The GSR inductor control output ($V_{SR}$) can swing at twice the supply voltage. The circuit is in fact a PMOS complement of PSR driver discussed in FIG. 6A. When the PMOS switch is closed, the inductor series resonates with the capacitance $C_{M2}$ and $C_{Mr}$. Due to the additional $C_{Mr}$ driver gate capacitance, the series inductor $L_{PW}$ needs to be scaled with respect to $L_D$, to give the pulse width of 0.5 $T_R$ timing needed at $V_{SR}$.

To show with some example values in a typical embodiment, for large load capacitances (>10 pF) the resonant inductance values are quite small (<0.1 nH) allowing the use of larger values of $L_{PW}$ to give lower area $C_{M2}$. In one example, for load capacitors, a QC>30 is assumed at 5 GHz giving less than 1-ohm of series resistance per 1 pF. While the aspect ratio W/L is indeed large (>600), resulting gate capacitance of 0.25 pF increases the switching power (dynamic power consumption) of a 10 pF load only by $1/20^{th}$. For example, in a 22 nm process the gate area of the extra driver is 600μ wide×22 nm long. The capacitance per unit area is more than 37 fF/μ². The total additional capacitance to be driven is less than 600×0.022×37 fF<0.5 pF. The dominant PSR pre-driver capacitance is 2 $C_L$ for dynamic power calculations and can thus be effectively scaled to <0.2*$C_L$ for large loads by using 10× $L_{PW}$ inductor value.

This extra power consumption is amortized over the entire clock drive network of a large number of drivers. The cost (in terms of layout area overhead) of using this pre-driver in FIG. 7 is not high. It is equivalent to the active area and switching power of 10 logic inverters, and capacitance less than 2 CL. This total capacitance comes from the input delay circuit (CM1) in FIG. 7 and from the voltage doubler output capacitance (that absorbs the gate capacitance of the Mr switch $C_{Mr}$<CL/20). The effective capacitance area can be further reduced to be <0.2 CL using 10× Miller gain and 10× larger inductor value than of the driver inductance value LS. The inductor area is only in metal and does not consume active area. Additional capacitance from inverters is negligible. In a typical embodiment, each logic inverter (termed INV) has total input and output capacitance<CL/20 across various submicron processes, from 90 nm to 7 nm.

Figure 8B:
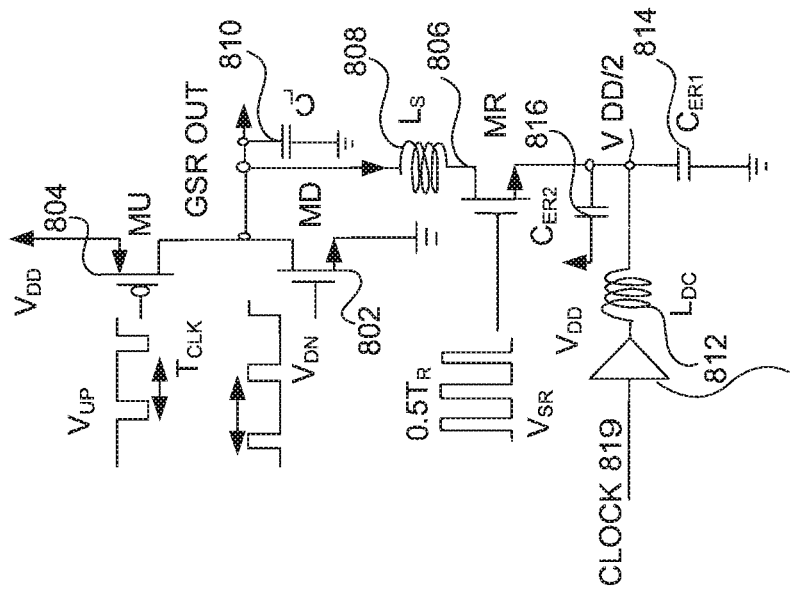
FIGS. 8A-8C show embodiments of a resonant driver for general applications with bias generation scheme.
Figure 8A:
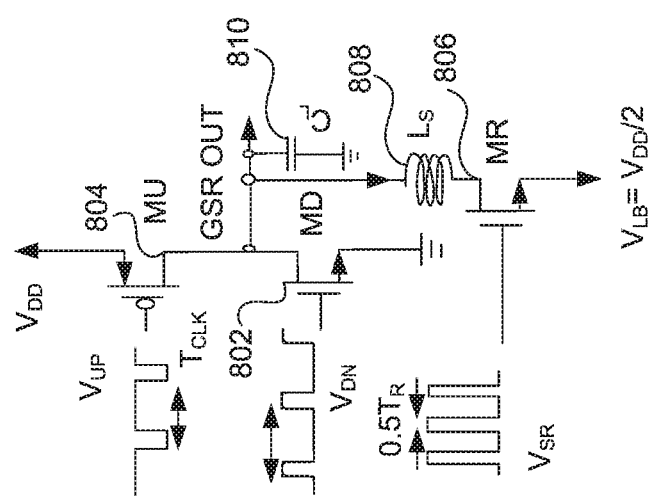

This is similar to the overhead for the NR case with conventional tapered buffers. The signal generator of FIG. 7 can be shared among 3 or more PSRs with the same $T_{PW}$ requirements to reduce power and area overhead to less than 0.2 $C_L$ $V_{DD}$ $f_{CLK}$. The use of inductors in pre-drivers as well, lowers the power needed to drive capacitive loads in the support circuitry while achieving the doubler function. In one example, while the doubled voltage means 40% additional power ($0.2*C*V^2f_{CLK}$) for the entire CDN, the PSR structure reduces this extra power to less than 14% ($0.4*\frac{1}{3}^{rd}$). The bias voltages needed by CPR, PSR and GSR described later are readily available in modern multi-voltage domain SoCs, especially in mobile processors. The $V_{DD}/2$ bias line draws no effective power because more current is pushed into it than pulled out. FIGS. 8A and 8B show embodiments of resonant driver termed GSR (Generalized Series Resonance) driver, for multiple applications, combined with bias generation schemes.

As noted above, no effective power is consumed in bias generator as more current is pushed into it than pulled out. The output impedance requirement of this, as a fraction of total resistance RT, can be calculated so that Q is not degraded to adversely affect the condition for underdamped oscillation and performance. For efficient energy savings, the output impedance of these is targeted to be less than 10% of the switch on-resistance.

Figure 8C:
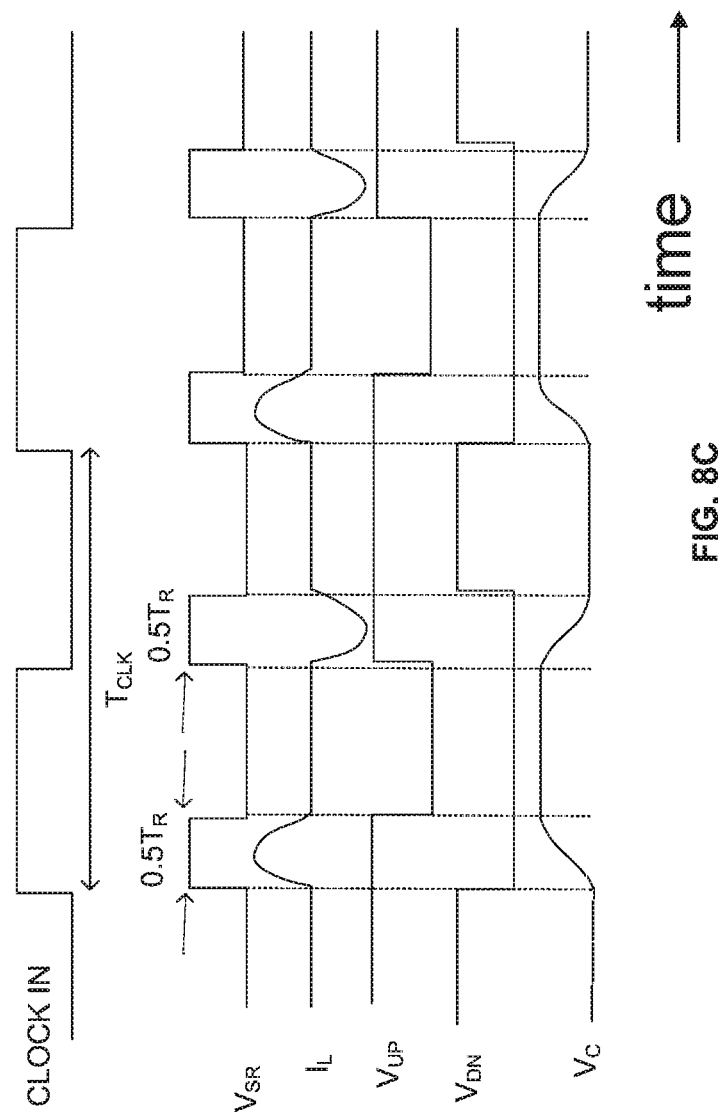

FIGS. 8A and 8B show embodiments of resonant drivers that are called "GSR (Generalized Series Resonance)," combined with bias generation schemes. This can be used for multiple applications. It shows transistor-level implementation (e.g., transistors 802, 804, 806) of the GSR driver output stage with all the incoming control signals. In the case of the scheme shown in FIG. 8A for GSR full configuration with bias voltage, a separate inductor bias supply $V_{LB}$ is used. This scheme includes an inductor $L_s$ 808 and load capacitor 810. As another example, FIG. 8B uses a large capacitor Cer1 814 for $V_{LB}$ instead of a DC supply for GSR full configuration with capacitor bias. The clock input is buffered and filtered using $L_{DC}$ 812 and total capacitance ($C_{ER1}+C_{ER2}$) to pre-bias the line as needed. The capacitor 814 is charged to mid-voltage $V_{DD}/2$ by filtering a buffered version of the input clock signal CLOCKin, that is typically 50% duty cycle. In a typical embodiment, the value of Inductor $L_{DC}$ is approximately 10-100 times larger than the output resonating inductor L. Capacitors $C_{ER1}$ 814 and $C_{ER2}$ 816 are taken to be roughly $5 \times C_L$. The input clock to this circuit may be gated as needed to reduce the extra power consumption. FIG. 8C illustrates different waveforms of CLOCKin, Vsr, $i_L$, $V_{UP}$, $V_{DN}$, and Vc signals for FIGS. 8A-8B.

Figure 9:
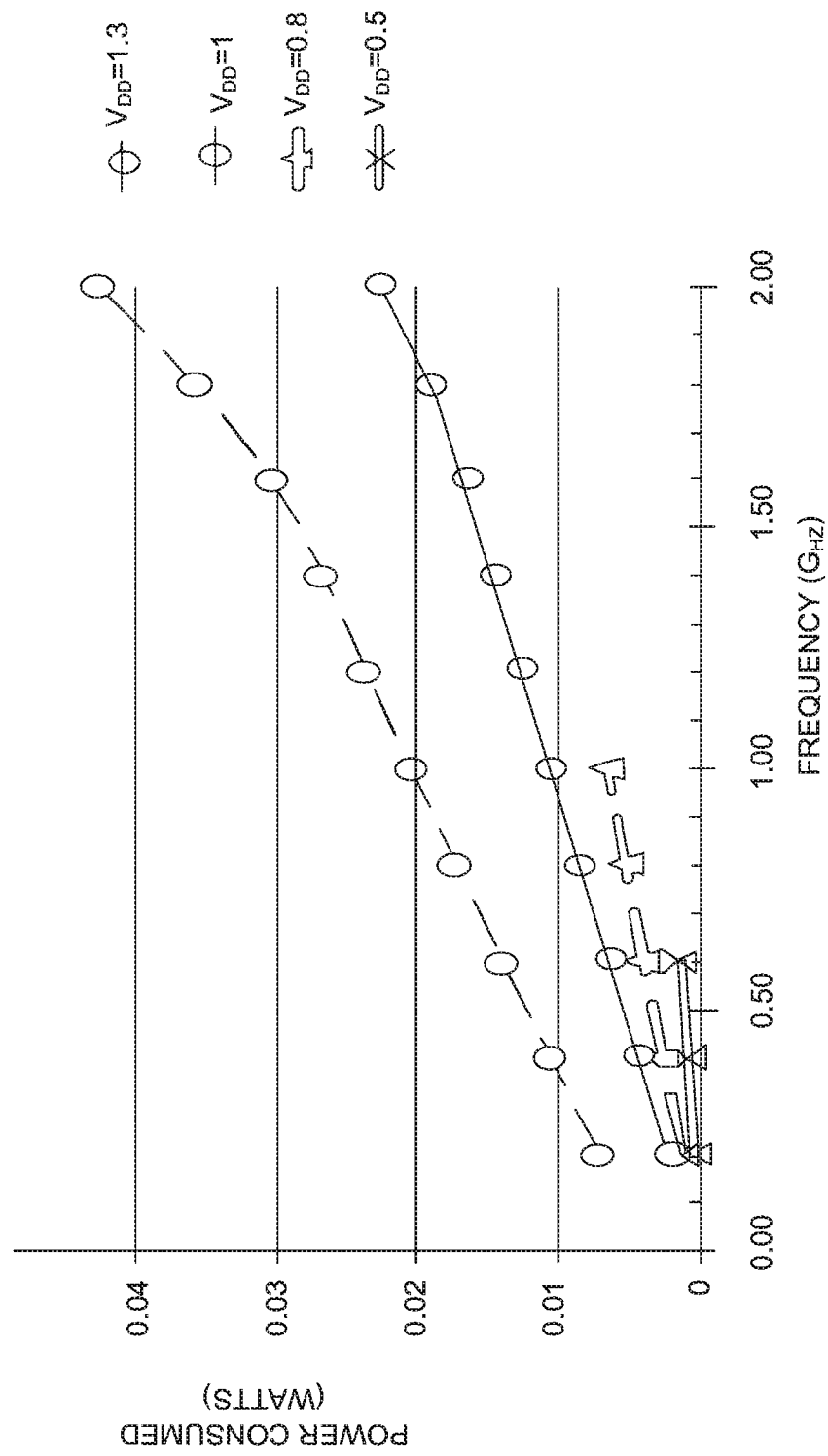
FIG. 9 shows DVFS compatibility of one embodiment of the present invention.
Figure 10:
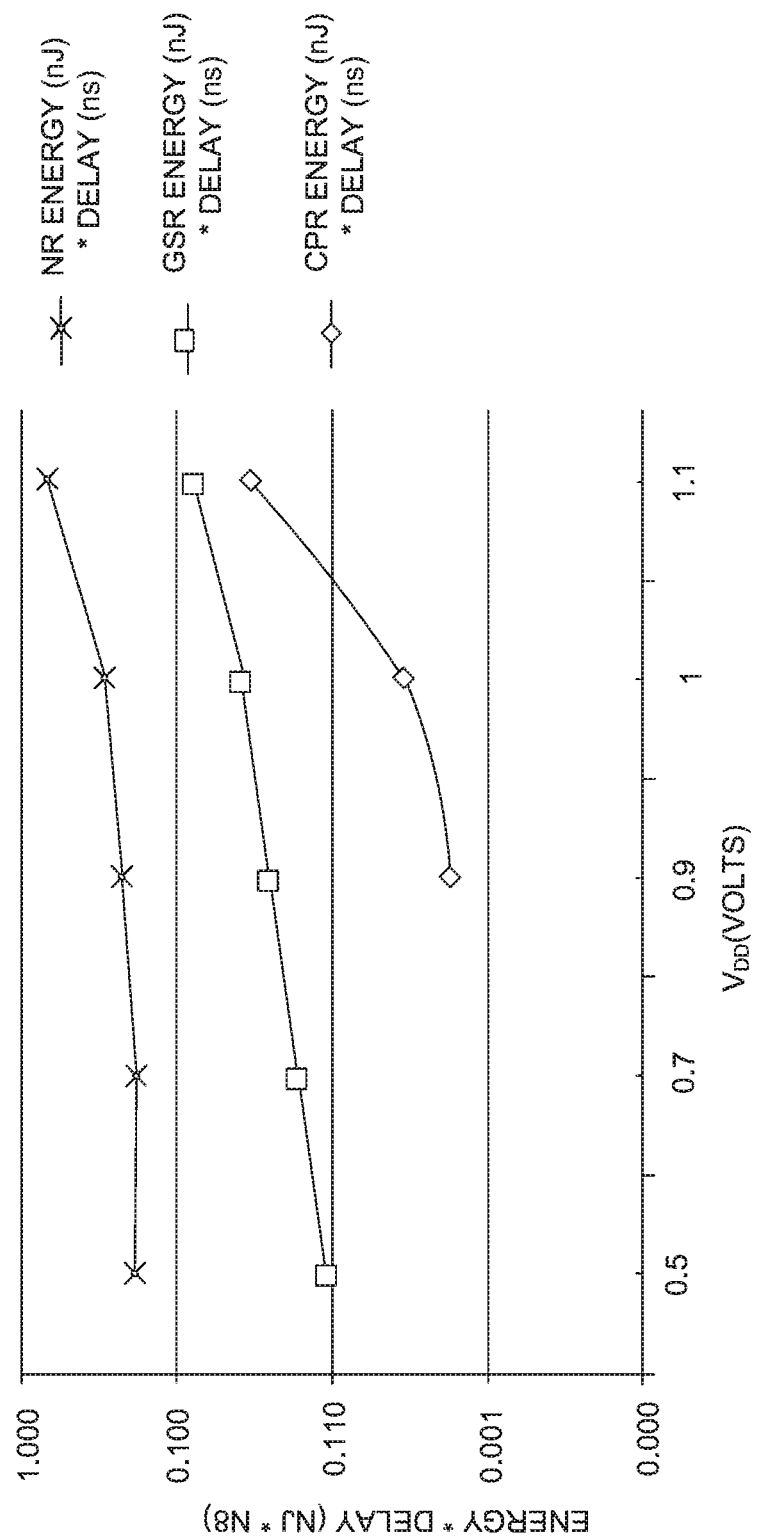
FIG. 10 shows an Energy-Delay Product for NR, CPR and GSR in accordance with one embodiment.

In another example, a series resonance configuration for clock signal energy recovery with a functioning bias circuit (800) is implemented using an already available clock input (819), a buffer (820), a clock input inductor LDC (812) and two storage capacitors CER1 (814) and CER2 (816), so that the clock input charges the storage capacitors CER1 and CER2 to develop a predetermined DC bias voltage VDC (e.g., VDD/2). In one example, the inductor (812) is about 5 to 50 times the value of the output resonanting inductor L (808), and said storage capacitances are at about 3 to 7 times the load capacitance 810. Turning our attention now to FIG. 9, the non-interfering method for embodiments of the present invention clearly provides less heat generation and provides energy reuse. FIG. 9 illustrates a plot of power consumed on a vertical axis versus frequency on a horizontal axis for different values of VDD. Using GSR as an example, and comparing GSR to CPR and NR, operation at multiple voltages is shown in FIG. 10, plotting the power drawn from the supply for driving a 20 pF load in the functional frequency range for DVFS. Higher $V_{DD}$ supply voltages give large frequency sweep but take higher power. Power can be saved by moving to an operating point of lowest $V_{DD}$ for a given frequency. No interconnect resistance is factored so that output swings rail-to-rail with a tank Q=3. Lower supply voltages give lower maximum frequency but take less power at functional frequencies. The ability to scale voltages down to the minimum needed at any given frequency enables DVFS. The quadratic relation of power to $V_{DD}$ explains the spacing between the curves. The GSR simulated power at 1 V and 1 GHz is nearly half of $C_L*V_{DD}f_{CLK}$.

FIG. 10 shows graphical plots of the simulated Energy-Delay products ("E-D products") for realistic NR, CPR and GSR implementations. Modern low power designs employ quantitative Pareto Analysis to arrive at best configuration and operating conditions. Combining the insertion delay and power graphs into a combined metric of Energy-Delay product (or speed/power metric) shown in FIG. 10 allows for a holistic view of topology selection. FIG. 10 shows the Energy-Delay (E-D) product for NR, CPR and GSR to see the figure of merit of one over the other. CPR has the lowest (best) values since the insertion delays are the lowest due to little overhead in terms of pre-driver delay, although the driver itself is slower than other schemes. However, the operating frequency is only valid over a small range of voltages over which frequencies around the resonance are supported. GSR is a good balance between NR and CPR. By plotting energy vs. delay as in FIG. 10, Pareto Analysis can be more effectively used. Area can be factored in the Pareto chart as well to do a comprehensive PPA (Power Performance Area) analysis. Energy-delay metric is usually improved with technology scaling with 'More of Moore'. FIG. 10 shows how it can be improved through the use of inductors, which is basically a 'More than Moore' solution.

Figure 11:
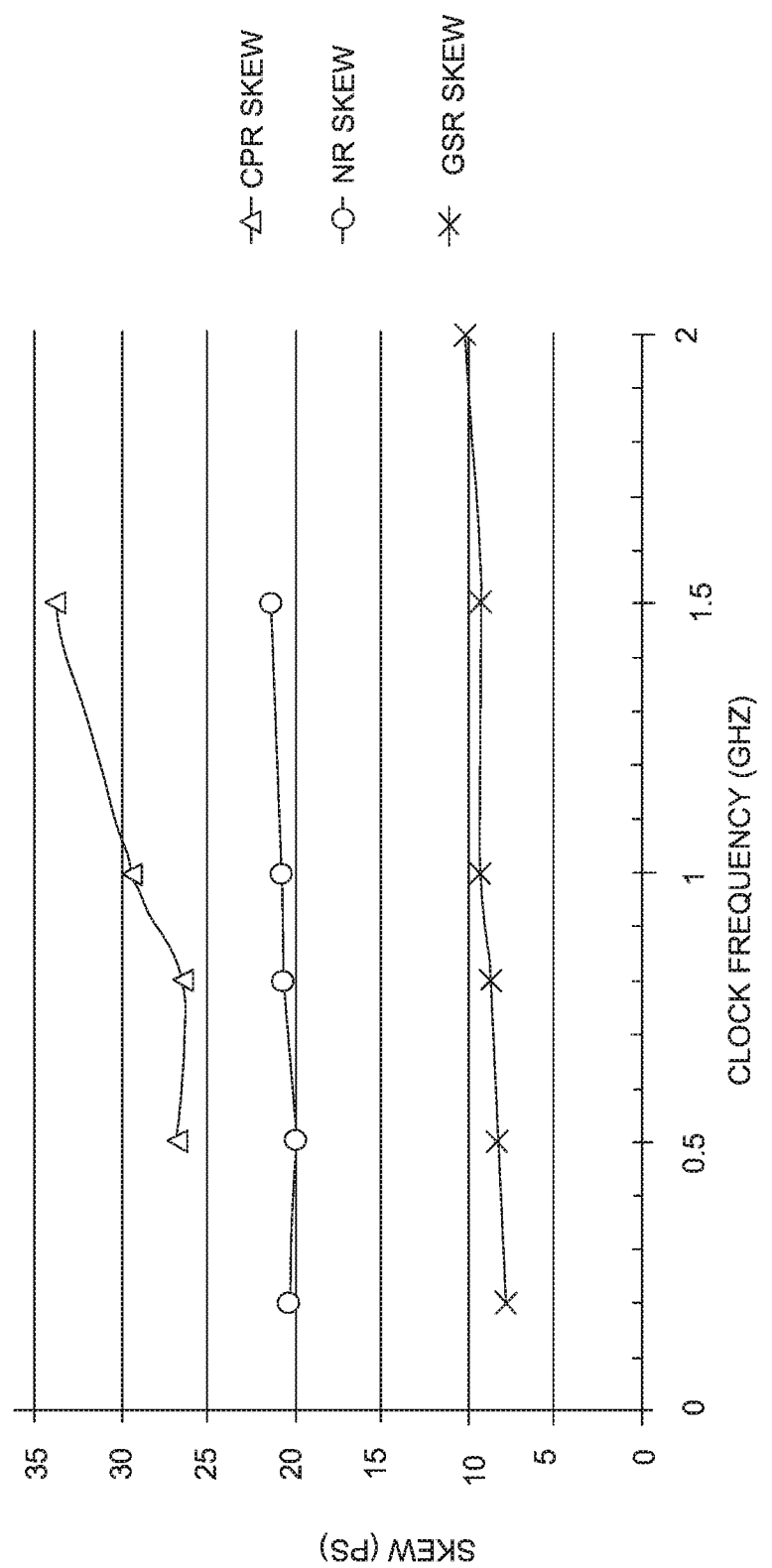
FIG. 11 illustrates skews across operating frequencies in accordance with one embodiment.

FIG. 11 shows skews across operating frequencies in accordance with one embodiment. Receiving local buffers will have varying logic thresholds that will cause appreciable skew for large slew rates. These thresholds will also vary due to dynamic supply variations causing jitter. For minimum skew, it is preferred to drive NR without distributed pre-drivers. Similarly, GSR and CPR with all inductors at source give minimum skew. However, due to Q degradation, this will consume more power than inductors distributed at sink points. FIG. 11 shows skews extracted from simulations over the DVFS frequency range for 160 pF H-tree for topologies at 1 V operation. Skew is the highest for CPR which has the largest power savings. NR has 10 ps more skew than GSR. This is the true clock performance for a given power that needs to be considered.

The GSR can give the lowest skew all the way to 2 GHz, using the well controlled falling edge as the trigger. CPR shows the highest skew and, like NR, cannot achieve functional swing at 2 GHz. With wider interconnects, target skew and functionality can be met in CPR, and NR as well, but at the expense of significant increase in the load capacitance and power. This again illustrates the fundamental trade-off between energy and delay, as one needs to be increased to decrease the other.

GSR gives low power performance below the resonance frequency $f_R$. However, with run-time reconfiguration to CPR using the same inductor, its operation can be increased to $f_R$.

FIG. 3 shows an embodiment that can provide the basis for a high performance CDN Mesh/Grid with DVFS operation from 2 GHz@1V to 500 MHz@0.5V in one example. This saves more than 25% of the dynamic power on a 45 nm process from ISPD2010 benchmarks. GSR based solutions have Run-time Digital Tuning capability for power and skew optimizations by varying resonance pulse width $T_R$. Resonance is achieved with smaller inductors occupying only the top metal area. The inductors are placed in the bottom rail of resonant drivers. A large clock mesh capacitance of 1 nF is targeted.

Unless the context clearly requires otherwise, throughout the description and the claims, the words "comprise," "comprising," and the like are to be construed in an inclusive sense (i.e., to say, in the sense of "including, but not limited to"), as opposed to an exclusive or exhaustive sense. As used herein, the terms "connected," "coupled," or any variant thereof means any connection or coupling, either direct or indirect, between two or more components. Such a coupling or connection between the components can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the invention is not intended to be exhaustive or to limit the invention to the precise form disclosed above.

While specific examples for the invention are described above for illustrative purposes, various equivalent modifications are possible within the scope of the invention, as those skilled in the relevant art will recognize. While processes or blocks are presented in a given order in this application, alternative implementations may perform routines having steps performed in a different order, or employ systems having blocks in a different order. Some processes or blocks may be deleted, moved, added, subdivided, combined, and/or modified to provide alternative or sub-combinations. Also, while processes or blocks are at times shown as being performed in series, these processes or blocks may instead be performed or implemented in parallel, or may be performed at different times. Further any specific numbers noted herein are only examples. It is understood that alternative implementations may employ differing values or ranges.

The various illustrations and teachings provided herein can also be applied to systems other than the system described above. The components and acts of the various examples described above can be combined to provide further implementations of the invention.

Any patents and applications noted above are incorporated herein by reference. Aspects of the invention can be modified, if necessary, to employ the systems, functions, and concepts included in such references to provide further implementations of the invention.

These and other changes can be made to the invention in light of the above Detailed Description. While the above description describes certain examples of the invention, and describes the best mode contemplated, no matter how detailed the above appears in text, the invention can be practiced in many ways. Details of the system may vary considerably in its specific implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated.

In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

While certain aspects of the invention are presented below in certain claim forms, the applicant contemplates the various aspects of the invention in any number of claim forms. For example, while only one aspect of the invention is recited as a means-plus-function claim under 35 U.S.C. § 112, sixth paragraph, other aspects may likewise be embodied as a means-plus-function claim, or in other forms, such as being embodied in a computer-readable medium. (Any claims intended to be treated under 35 U.S.C. § 112, ¶6 will begin with the words "means for.") Accordingly, the applicant reserves the right to add additional claims after filing the application to pursue such additional claim forms for other aspects of the invention. It should be understood that, within the scope of the appended claims, this invention may be practiced otherwise than as specifically described.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A digital driver having a wide operating frequency range, comprising:
    a pulldown switch;
    a pullup switch;
    an energy saving component coupled in series with the pulldown switch and the pullup switch; and
    a reference supply connected in series with the energy saving component that is configured to resonate with a load capacitance and reuse electrical energy at the load capacitance without interfering with an output signal path of the digital driver having the wide operating frequency range due to the energy saving component being electrically coupled to the output signal path periodically, wherein the energy saving component and the load capacitance (LC) form a series resonant frequency that is at least three time greater than a maximum clock rate of the digital driver to avoid interfering with the output signal path and a power saving operation is valid for all clock rates of the digital driver below one third (⅓) of the series resonant frequency.

2. The digital driver of claim 1, wherein the pullup switch is further connected in series with a power supply, the energy saving component configured to enable the driver to be capable of resonating with the load capacitance, wherein the pullup switch is designed with a first ratio of width to length that is less than a second ratio of width to length of the pulldown switch due to functionality of the pullup switch being partially performed with energy recycling resonance when the driver resonates with the load capacitance.

3. The digital driver of claim 1, further comprising:
    a pullup switch in series with an energy saving adiabatic power supply.

4. The digital driver of claim 1, wherein the energy saving component comprises a resonant inductor component electrically coupled to the pulldown switch of the digital driver, the resonant inductor component configured to enable the digital driver to operate in a resonant mode.

5. The digital driver of claim 1, wherein the digital driver is capable of being gated to be off in a high-impedance mode, without a shorting path at the output through the energy saving component.

6. The digital driver of claim 1, further comprising:
a control circuitry for the digital driver that compromises a digital clock driver, wherein the digital clock driver does not have a plurality of devices interfering with a signal node, to control the clock features including pulse width, duty cycle or transition times.

7. The digital driver of claim 1, wherein the inductor capacitor (LC) series resonant frequency is 3 times a maximum clock rate and a power saving operation is valid for all clock rates below one third of said LC series resonant frequency.

8. A method of operation of a digital driver, the method comprising:
series connecting a first terminal of an inductive component to a pulldown switch and a pullup switch of an inverter with an automated digital auto place route design tool;
series connecting a second terminal of the inductive component to a lower voltage bias of the inverter; and
configuring the inductive component to enable the digital driver to operate in a resonant mode and reuse electrical energy at a load capacitance without interfering with an output signal path of the digital driver due to the inductive component being electrically coupled to the output signal path periodically, wherein the inductive component and the load capacitance (LC) form a series resonant frequency that is at least three time greater than a maximum clock rate of the digital driver to avoid interfering with the output signal path and a power saving operation is valid for all clock rates of the digital driver below one third (⅓) of the series resonant frequency.

9. The method of claim 8, wherein the pullup switch is designed with a first ratio of width to length that is less than a second ratio of width to length of the pulldown switch due to functionality of the pullup switch being partially performed with energy recycling resonance when the driver resonates with the load capacitance.

10. The method of claim 9, wherein the inductive component comprises an inductor for a resonant path positioned between the pulldown switch of the digital driver and the lower bias voltage, or between the pulldown switch of the digital driver and another node.

11. The method of claim 10, wherein the inductor for the resonant path positioned in a separate path with a separate switch other than the pulldown switch of the digital driver, where said inductor can be positioned above the separate switch, or below the separate switch.

12. The method of claim 8, wherein the inductive component for resonance can be comprised of two or more inductive components, and said components placed above a switch, below a switch, or a placed in more than one location.

13. The method of claim 8, wherein a combination of Pulsed Series Resonance (PSR) and generalized series resonance (GSR) is used including a resonant inductive component being placed between a drain terminal of the pulldown switch of the digital driver and another node, or between a source terminal of the pulldown switch and the lower bias voltage; and, in addition one or more resonant inductive components are placed above or below the switch of the separate GSR resonant path.

14. A digital driver having a wide operating frequency range, comprising:
a pullup switch and a pulldown switch;
a first inductive component coupled in series with the pullup switch and the pulldown switch; and
a bias voltage connected in series with the pulldown switch and the first inductive component that is configured to have generalized series resonance with a load capacitance and reuse electrical energy at the load capacitance without interfering with an output signal path of the digital driver having the wide operating frequency range due to the first inductive component being electrically coupled to the signal path periodically, wherein the first inductive component and the load capacitance (LC) form a generalized series resonant frequency that is at least three time greater than a maximum clock rate of the digital driver to avoid interfering with the output signal path and a power saving operation is valid for all clock rates of the digital driver below one third (⅓) of the generalized series resonant frequency.

15. The digital driver of claim 14, wherein the pullup switch is designed with a first ratio of width to length that is less than a second ratio of width to length of the pulldown switch due to functionality of the pullup switch being partially performed with energy recycling resonance when the driver resonates with the load capacitance.

16. The digital driver of claim 14, wherein the pulldown switch to receive an input pulse signal.

17. The digital driver of claim 14, further comprising:
a second inductive component coupled to the bias voltage of the pulldown switch, the second inductive component to receive a clock signal and to generate a filtered output signal.

18. The digital driver of claim 17, further comprising:
a first capacitor to provide a first bias for the bias voltage of the pulldown switch; and
a second capacitor to provide a second bias for the bias voltage of the pulldown switch.

19. The digital driver of claim 14, wherein the digital driver having the wide operating frequency range is compatible with dynamic voltage and frequency scaling (DVFS).

* * * * *